United States Patent
Tong et al.

(10) Patent No.: US 9,142,693 B2
(45) Date of Patent: Sep. 22, 2015

(54) OPTOELECTRONIC PACKAGE AND METHOD FOR MAKING SAME

(71) Applicant: SAE Magnetics (H.K.) Ltd., Hong Kong (HK)

(72) Inventors: Dennis Tak Kit Tong, Hong Kong (HK); Vincent Wai Hung, Hong Kong (HK); Danny Chih Hsun Lin, Hong Kong (HK); Francis Guillen Gamboa, Hong Kong (HK)

(73) Assignee: SAE MAGNETICS (H.K.) LTD., Hong Kong (HK)

( * ) Notice: Subject to any disclaimer, the term of this patent is extended or adjusted under 35 U.S.C. 154(b) by 43 days.

(21) Appl. No.: 13/860,531

(22) Filed: Apr. 11, 2013

(65) Prior Publication Data

US 2013/0270584 A1    Oct. 17, 2013

Related U.S. Application Data

(60) Provisional application No. 61/623,078, filed on Apr. 12, 2012.

(51) Int. Cl.

| | |
|---|---|
| *H01L 25/07* | (2006.01) |
| *H01L 33/62* | (2010.01) |
| *H01L 31/0203* | (2014.01) |
| *H01L 33/52* | (2010.01) |
| *H01L 33/00* | (2010.01) |
| *H01L 33/58* | (2010.01) |
| *H01L 23/10* | (2006.01) |

(52) U.S. Cl.
CPC ............ *H01L 31/0203* (2013.01); *H01L 23/10* (2013.01); *H01L 33/0095* (2013.01); *H01L 33/52* (2013.01); *H01L 33/58* (2013.01); *H01L 2924/0002* (2013.01); *H01L 2933/0058* (2013.01)

(58) Field of Classification Search
CPC ... H01L 25/0753; H01L 33/62; H01L 27/153; H01L 33/20; F21K 9/00
USPC ............................ 257/88; 438/22, 24, 46, 47
See application file for complete search history.

(56) References Cited

U.S. PATENT DOCUMENTS

| | | | | |
|---|---|---|---|---|
| 4,630,158 | A * | 12/1986 | Spash | 360/245 |
| 2006/0216856 | A1* | 9/2006 | Zhao | 438/106 |
| 2009/0321760 | A1* | 12/2009 | Kuhmann | 257/98 |
| 2010/0044726 | A1* | 2/2010 | Li et al. | 257/88 |
| 2010/0127391 | A1* | 5/2010 | Hasegawa | 257/719 |

* cited by examiner

*Primary Examiner* — Steven Loke
*Assistant Examiner* — Didarul Mazumder

(57) ABSTRACT

An optoelectronic package includes a substrate and a cover element bonded onto the substrate. The cover element defines a cavity for accommodating semiconductor chips and optoelectronic components. The cover element includes a first adhesive bonding area configured for receiving a first adhesive and being bonded with a predetermined region of the substrate by the first adhesive. The engagement of the cover element and the substrate defines a second adhesive bonding area. The second adhesive bonding area is configured for receiving a second adhesive and confining the second adhesive within a localized area. A method for making an optoelectronic package is also provided.

2 Claims, 7 Drawing Sheets

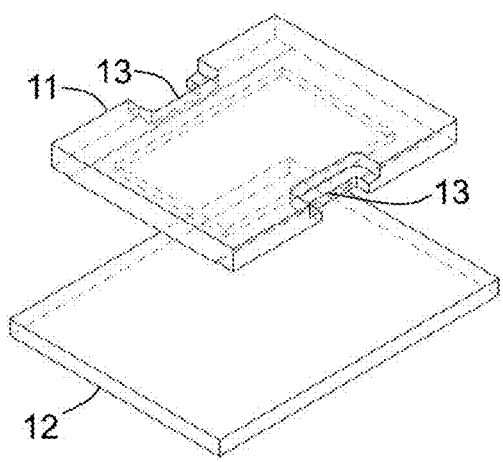
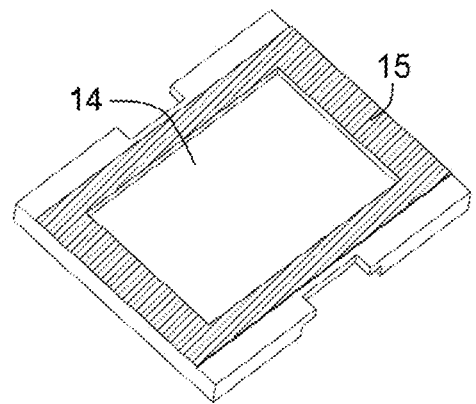
FIG. 3a
FIG. 3b
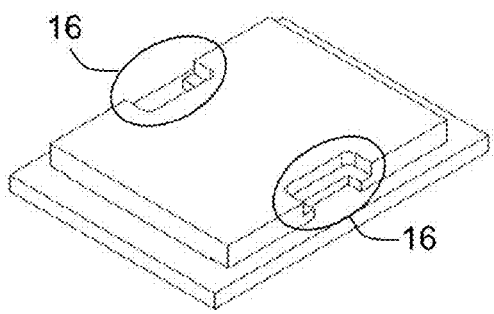
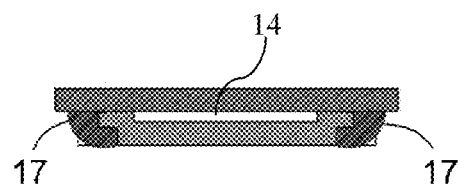
FIG. 3c
FIG. 3d

OPTOELECTRONIC PACKAGE AND METHOD FOR MAKING SAME

CROSS-REFERENCE TO RELATED APPLICATIONS

This application claims the benefit of U.S. Provisional Patent Application No. 61/623,078 filed on Apr. 12, 2012, the contents of which is hereby incorporated by reference.

FIELD OF THE PATENT APPLICATION

The present patent application generally relates to semiconductor chip packaging technologies and more specifically to an optoelectronic package that maintains high alignment precision and high bonding strength, and a method for making the same.

BACKGROUND

Semiconductor electronics components packaged using chip-on-board (COB) processes often employ a cover element to protect silicon chips from physical damages as well as particle and moisture attacks. This cover element is often bonded onto a circuit substrate using adhesives. The underside of the cover element forms a protective cavity in which the silicon chips are located. To ensure reliability of the package, a strong bonding force between the cover element and the substrate is required throughout the lifetime of the product.

As illustrated in FIG. 1, when such packaging is used for optoelectronics components, the cover element may also serve additional optical functions. For example, lens structures may be formed on the cover element to facilitate optical signal coupling. This additional optical functionality can only be realized if the alignment of the cover element to the optoelectronics chips inside the cavity is precisely maintained (<15 um misalignment) during the assembly process and throughout the lifetime of the product.

Two types of adhesives are conventionally used in bonding the cover element to the substrate: UV-activated epoxy and thermally-activated epoxy. The former provides fast curing time and minimal curing shift while the latter provides stronger bonding strength but requires longer curing time and introduces larger post-curing shift between the two parts.

SUMMARY

The present patent application is directed to an optoelectronic package. In one aspect, the optoelectronic package includes a substrate and a cover element bonded onto the substrate. The cover element defines a cavity for accommodating semiconductor chips and optoelectronic components. The cover element includes a first adhesive bonding area configured for receiving a first adhesive and being bonded with a predetermined region of the substrate by the first adhesive. The engagement of the cover element and the substrate defines a second adhesive bonding area. The second adhesive bonding area is configured for receiving a second adhesive and confining the second adhesive within a localized area.

The cover element may include two steps defining two cutout regions formed at two opposite sides of the cover element respectively, the engagement of the two steps and the substrate defining the second adhesive bonding area.

The cover element may include two thinned-down regions formed at two opposite sides of the cover element respectively, the engagement of the two thinned-down regions and the substrate defining the second adhesive bonding area. A through hole may be formed within each of the thinned-down regions and configured for improving the confinement of the second adhesive.

Two through slots may be formed at two opposite sides of the substrate respectively, the engagement of the two through slots and the cover element defining the second adhesive bonding area. An additional step may be formed inside each of the through slots and configured for increasing the area of the substrate within the through slots that contacts the second adhesive. Two openings may be formed at two opposite sides of the cover element respectively, the engagement of the two through slots and the two openings defining the second adhesive bonding area. The two through slots and the two openings may be aligned forming two through cavities respectively, the through cavities being configured for receiving the second adhesive and providing paths for air to escape when the second adhesive is applied.

Two undercuts may be formed at two opposite sides of the substrate respectively, the engagement of the two undercuts and the cover element defining the second adhesive bonding area. The undercuts may be aligned with and extending from edges of the cover element, forming a cavity underneath the cover element, the cavity being configured for receiving the second adhesive so that the second adhesive is extended from the cavity to cover sides of the cover element.

Two cutouts may be formed at two opposite sides of the cover element respectively and aligned with the two undercuts respectively, the engagement of the two undercuts and the two cutouts defining the second adhesive bonding area.

In another aspect, the present patent application provides a method for making an optoelectronic package. The method includes: applying a first adhesive to a first adhesive bonding area of a cover element; placing the cover element onto a substrate so that the first adhesive bonding area of the cover element is in direct contact with a predetermined region of the substrate; curing the first adhesive so as to secure the cover element onto the substrate; applying a second adhesive to a second adhesive bonding area defined between the cover element and the substrate; and curing the second adhesive. The second adhesive bonding area is defined through the engagement of the cover element and the substrate, and configured to allow the second adhesive to be in direct contact with both the cover element and the substrate, and confined within a localized area.

The method may further include assembling semiconductor chips and optoelectronic components onto the substrate before applying the first adhesive to the first adhesive bonding area.

The method may further include employing a precision placement process to align functional features on the cover element with the optoelectronic components.

The second adhesive may be cured by a longer curing process than the first adhesive. The first adhesive may be cured by ultra-violet light. The second adhesive may be cured by thermal curing.

In yet another aspect, the present patent application provides an optoelectronic package that includes a substrate and a cover element bonded onto the substrate. The cover element defines a cavity for accommodating semiconductor chips and optoelectronic components, and includes functional features aligned with the optoelectronic components. The cover element includes a first adhesive bonding area configured for receiving a first adhesive and being bonded with a predetermined region of the substrate by the first adhesive. The engagement of the cover element and the substrate defines a second adhesive bonding area. The second adhesive bonding area is configured for receiving a second adhesive and confining the second adhesive within a localized area.

The cover element may include two steps defining two cutout regions formed at two opposite sides of the cover element respectively, the engagement of the two steps and the substrate defining the second adhesive bonding area.

Two through slots may be formed at two opposite sides of the substrate respectively, the engagement of the two through slots and the cover element defining the second adhesive bonding area.

BRIEF DESCRIPTIONS OF THE DRAWINGS

FIG. 3a is an exploded view of an optoelectronic package according to an embodiment of the present patent application.

FIG. 3b is a bottom view of the optoelectronic package depicted in FIG. 3a.

FIG. 3c is a perspective view of the optoelectronic package depicted in FIG. 3a.

FIG. 3d is a cross-sectional view of the optoelectronic package depicted in FIG. 3a.

FIG. 4b is a perspective view of the optoelectronic package depicted in FIG. 4a.

FIG. 4d is a cross-sectional view of the optoelectronic package depicted in FIG. 4a.

FIG. 5b is a bottom view of a cover of the optoelectronic package depicted in FIG. 5a.

FIG. 5c is a bottom perspective view of the optoelectronic package depicted in FIG. 5a.

FIG. 5d is a cross-sectional view of the optoelectronic package depicted in FIG. 5a.

FIG. 6b is a perspective view of the assembled optoelectronic package depicted in FIG. 6a.

FIG. 6d shows cross-sectional views of the optoelectronic package depicted in FIG. 6a.

FIG. 7b is a cross-sectional view of the optoelectronic package depicted in FIG. 7a.

FIG. 8b is a perspective view of the assembled optoelectronic package depicted in FIG. 8a.

FIG. 8c is a cross-sectional view of the optoelectronic package depicted in FIG. 8a.

DETAILED DESCRIPTION

Reference will now be made in detail to a preferred embodiment of the optoelectronic package and the method for making the same disclosed in the present patent application, examples of which are also provided in the following description. Exemplary embodiments of the optoelectronic package and the method for making the same disclosed in the present patent application are described in detail, although it will be apparent to those skilled in the relevant art that some features that are not particularly important to an understanding of the optoelectronic package and the method for making the same may not be shown for the sake of clarity.

Furthermore, it should be understood that the optoelectronic package and the method for making the same disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
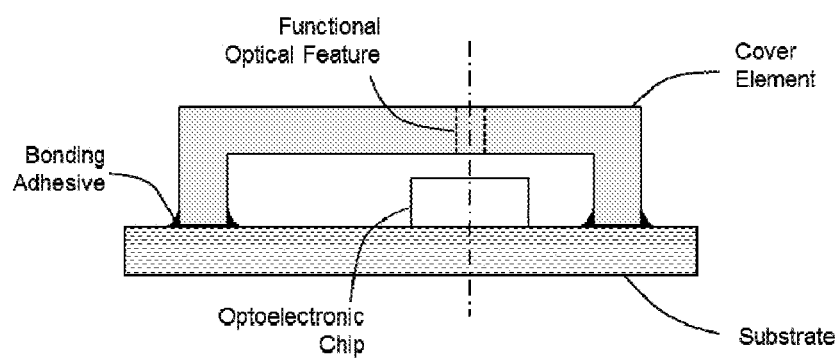
FIG. 1 is a cross-sectional view of a conventional optoelectronic package with a precision-aligned functional cover element.
Figure 2:
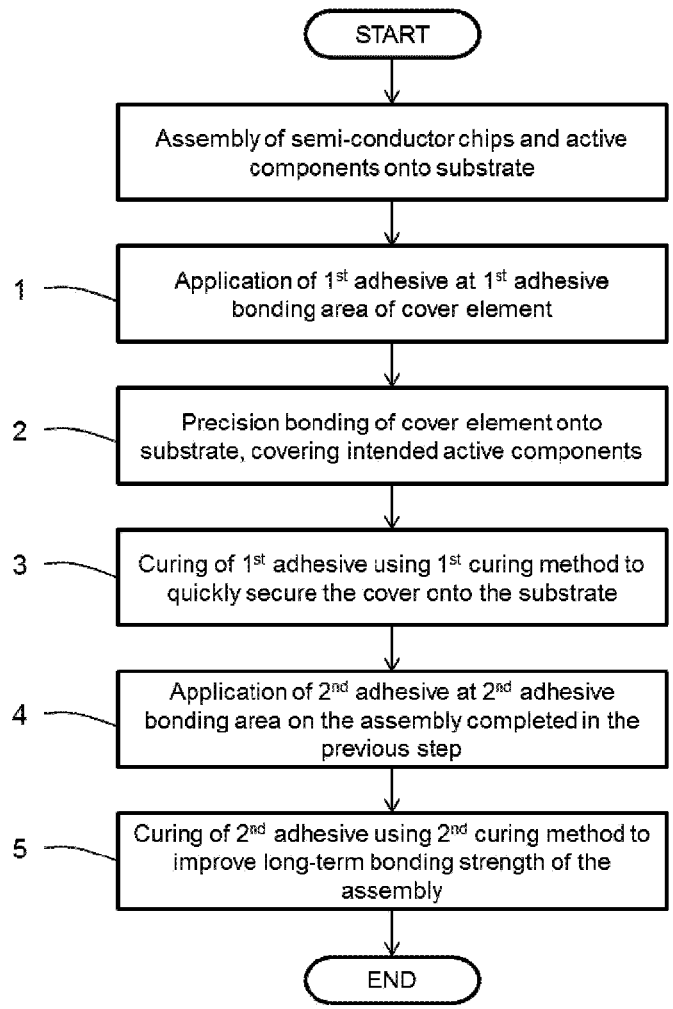
FIG. 2 is a flow chart illustrating a method for making an optoelectronic package according to an embodiment of the present patent application.

FIG. 2 is a flow chart illustrating a method for making an optoelectronic package according to an embodiment of the present patent application. In this method, a cover element is attached and bonded onto a substrate to form a completed module. Referring to FIG. 2, semiconductor chips and optoelectronic components are first assembled onto the substrate before the cover bonding process. Subsequently, in step 1, a first adhesive is applied onto a first adhesive bonding area of the cover element. In step 2, the cover element is placed onto the substrate, covering the populated components. The first adhesive bonding area of cover element is in direct contact with the substrate surface. A precision placement process is employed to align functional features on the cover element with the optoelectronic components. In step 3, the first adhesive is hardened by a fast curing process. One example of such process includes curing by ultra-violet (UV) light. This step bonds the cover element onto the substrate while fixing the alignment of the two parts to facilitate later processes. In step 4, a second adhesive is applied onto a second adhesive bonding area defined between the cover element and the substrate. The second adhesive bonding area is formed through the engagement of specific mechanical features on the cover element and the substrate, and configured to allow the second adhesive to come in direct contact with both the cover element and the substrate body while still being confined within a localized area. In step 5, a second and longer curing process is employed to cure the second adhesive. One example of such process is thermal curing. Such curing provides sufficient bonding strength to ensure long-term adhesion while maintaining the alignment of the two parts.

In the above embodiment, a method for making an optoelectronic package is provided. The method includes applying a first adhesive to a first adhesive bonding area of a cover element; placing the cover element onto a substrate so that the first adhesive bonding area of the cover element is in direct contact with a predetermined region of the substrate; curing the first adhesive so as to secure the cover element onto the substrate; applying a second adhesive to a second adhesive bonding area defined between the cover element and the substrate; and curing the second adhesive. The second adhesive bonding area is defined through the engagement of the cover element and the substrate, and configured to allow the second adhesive to be in direct contact with both the cover element and the substrate, and confined within a localized area.

FIG. 3a is an exploded view of an optoelectronic package according to an embodiment of the present patent application. FIG. 3b is a bottom view of the optoelectronic package depicted in FIG. 3a. FIG. 3c is a perspective view of the optoelectronic package depicted in FIG. 3a. FIG. 3d is a cross-sectional view of the optoelectronic package depicted in FIG. 3a.

Referring to FIG. 3a and FIG. 3b, the optoelectronic package includes a substrate 12 and a cover element 11 bonded onto the substrate 12. The cover element 11 defines a cavity 14 for accommodating semiconductor chips and optoelectronic components. Two steps 13 defining two cutout regions are respectively formed at two opposite sides of the cover element 11. The cover element 11 has a first adhesive application area 15. There are no special design features on the substrate 12. As shown in FIG. 3c, after the cover element 11 is bonded onto the substrate 12, the second adhesive is applied to a second adhesive bonding area 16, and flowing into a substrate region confined by the second adhesive bonding area 16. The steps 13 in the second adhesive bonding area 16 increase the adhesive contact area. The cured second adhesive forms the bonding region 17, which holds the cover element 11 and the substrate 12 together with high bonding force, as shown in FIG. 3d.

In the above embodiment, an optoelectronic package is provided. The optoelectronic package includes: a substrate 12; a cover element 11 bonded onto the substrate 12, the cover element 11 defining a cavity 14 for accommodating semiconductor chips and optoelectronic components. The cover element 11 includes a first adhesive bonding area 15 configured for receiving a first adhesive and being bonded with a predetermined region of the substrate 12 by the first adhesive. The engagement of the cover element 11 and the substrate 12 defines a second adhesive bonding area 16. The second adhesive bonding area 16 is configured for receiving a second adhesive and confining the second adhesive within a localized area. In this embodiment, the cover element 11 includes two steps 13 defining two cutout regions formed at two opposite sides of the cover element 11 respectively, the engagement of the two steps 13 and the substrate 12 defining the second adhesive bonding area 16.

Figure 4A:
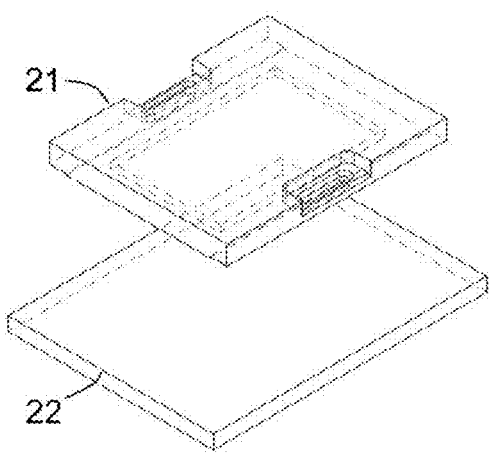
FIG. 4a is an exploded view of an optoelectronic package according to another embodiment of the present patent application.
Figure 4B:
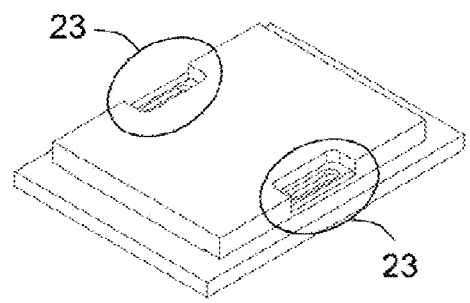
Figure 4C:
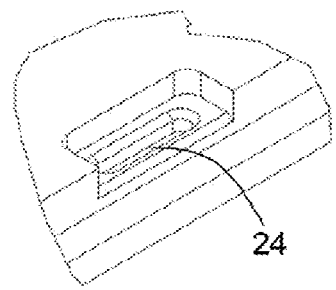
FIG. 4c is a partial magnified view of the optoelectronic package depicted in FIG. 4a illustrating a second adhesive bonding area.
Figure 4D:

FIG. 4a is an exploded view of an optoelectronic package according to another embodiment of the present patent application. FIG. 4b is a perspective view of the optoelectronic package depicted in FIG. 4a. FIG. 4c is a partial magnified view of the optoelectronic package depicted in FIG. 4a illustrating a second adhesive bonding area. FIG. 4d is a cross-sectional view of the optoelectronic package depicted in FIG. 4a. Referring to FIGS. 4a-4d, in this embodiment, the cover element 21 has the same back side design as in the embodiment illustrated in FIG. 3a. There are no special design features on the substrate 22. At the top side, there are two thinned-down regions 23 formed at two opposite sides of the cover element 21. After bonding the cover element 21 onto 22, the second adhesive is applied to the regions 23 and cured to form the bonding regions 25. Within each of the regions 23, there is a through slot 24 configured for better confinement of the second adhesive.

In the above embodiment, the cover element 21 includes two thinned-down regions 23 formed at two opposite sides of the cover element 21 respectively. The engagement of the two thinned-down regions 23 and the substrate 22 defines the second adhesive bonding area. A through hole 24 is formed within each of the thinned-down regions 23 and configured for improving the confinement of the second adhesive.

Figure 5A:
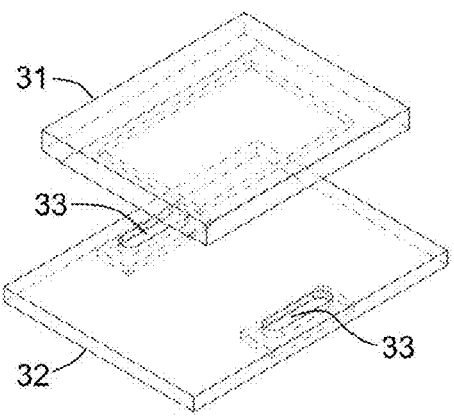
FIG. 5a is an exploded view of an optoelectronic package according to yet another embodiment of the present patent application.
Figure 5B:
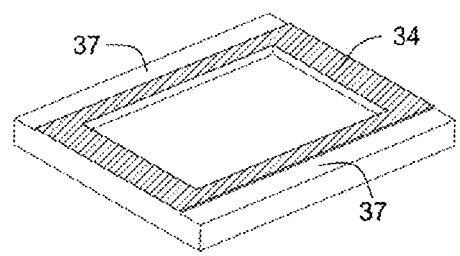
Figure 5C:
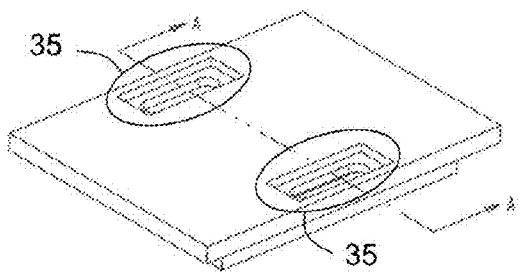
Figure 5D:
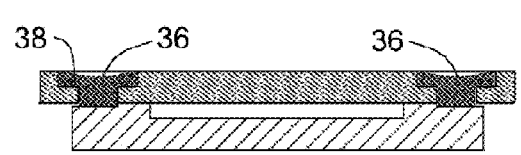

FIG. 5a is an exploded view of an optoelectronic package according to yet another embodiment of the present patent application. FIG. 5b is a bottom view of a cover of the optoelectronic package depicted in FIG. 5a. FIG. 5c is a bottom perspective view of the optoelectronic package depicted in FIG. 5a. FIG. 5d is a cross-sectional view of the optoelectronic package depicted in FIG. 5a. Referring to FIGS. 5a-5d, the area 34 is the region where the first adhesive is applied on the cover element 31. Through slots 33 are formed on the substrate 32. When the cover element 31 is aligned and bonded with the substrate 32, the openings of the through slots 33 are aligned with the region 37. After the curing of the first adhesive, the second adhesive is applied from the back side of the assembly through the openings 35. The second adhesive makes contact with the region 37 through the openings of through slots 33 and forms the second adhesive bonding points 36. An additional step 38 is present inside the through slots 33 and configured for increasing the adhesive contact area.

In the above embodiment, two through slots 33 are formed at two opposite sides of the substrate 32 respectively. The engagement of the two through slots 33 and the cover element 31 defines the second adhesive bonding area. An additional step 38 is formed inside each of the through slots 33 and configured for increasing the area of the substrate 32 within the through slots 33 that contacts the second adhesive.

Figure 6A:
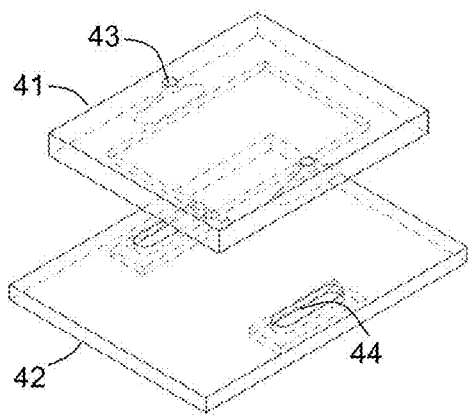
FIG. 6a is an exploded view of an optoelectronic package according to still another embodiment of the present patent application.
Figure 6B:
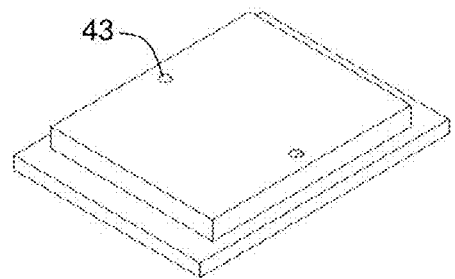
Figure 6C:
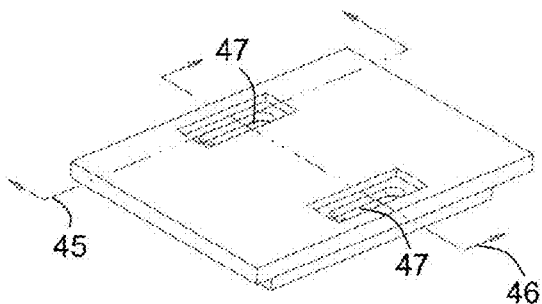
FIG. 6c is a bottom perspective view of the optoelectronic package depicted in FIG. 6a illustrating a second adhesive bonding area.
Figure 6D:
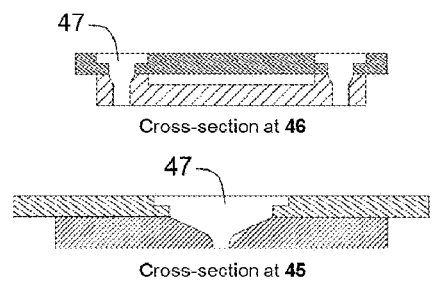

FIG. 6a is an exploded view of an optoelectronic package according to still another embodiment of the present patent application. FIG. 6b is a perspective view of the assembled optoelectronic package depicted in FIG. 6a. FIG. 6c is a bottom perspective view of the optoelectronic package depicted in FIG. 6a illustrating a second adhesive bonding area. FIG. 6d shows cross-sectional views of the optoelectronic package depicted in FIG. 6a. Referring to FIGS. 6a-6d, openings 43 and 44 are formed on the cover element 41 and the substrate 42 respectively. When the cover element 41 and the substrate 42 are aligned and bonded with the first adhesive, the openings 43 and 44 are also aligned forming a through cavity 47 in which the second adhesive is applied. The through cavity 47 provides a path for air to escape when the second adhesive is applied.

In the above embodiment, two openings 43 are formed at two opposite sides of the cover element 41 respectively. The engagement of the two through slots 44 and the two openings 43 defines the second adhesive bonding area. The two through slots 44 and the two openings 43 are aligned forming two through cavities 47 respectively. The through cavities 47 are configured for receiving the second adhesive and providing paths for air to escape when the second adhesive is applied.

Figure 7A:
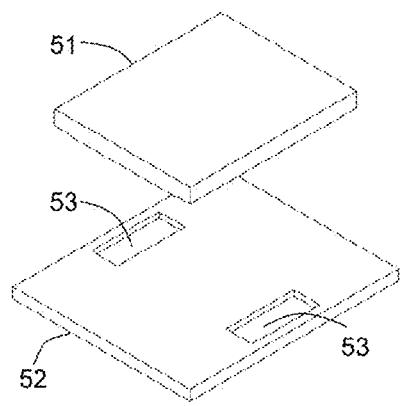
FIG. 7a is an exploded view of an optoelectronic package according to still another embodiment of the present patent application.
Figure 7B:
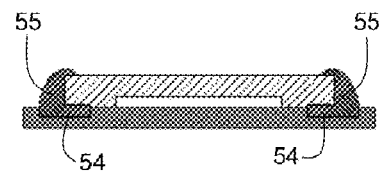

FIG. 7a is an exploded view of an optoelectronic package according to still another embodiment of the present patent application. FIG. 7b is a cross-sectional view of the optoelectronic package depicted in FIG. 7a. Referring to FIGS. 7a-7b, in this embodiment, undercuts 53 are formed on the substrate 52. When the cover element 51 is aligned with the substrate 52 and bonded onto the substrate 52 with the first adhesive, the undercuts 53 are aligned with and extending from the edges of the cover element 51 forming a cavity 54 underneath the cover element 51. The second adhesive is applied into the cavity 54 and extended to cover the sides of the cover element 51.

In the above embodiment, two undercuts 53 are formed at two opposite sides of the substrate 52 respectively, the engagement of the two undercuts 53 and the cover element 51 defining the second adhesive bonding area. The undercuts 53 are aligned with and extending from edges of the cover element 51, forming a cavity 54 underneath the cover element. The cavity 54 is configured for receiving the second adhesive so that the second adhesive is extended from the cavity 54 to cover sides of the cover element 51.

Figure 8A:
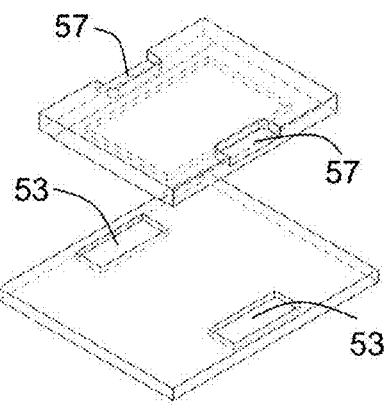
FIG. 8a is an exploded view of an optoelectronic package according to still another embodiment of the present patent application.
Figure 8B:
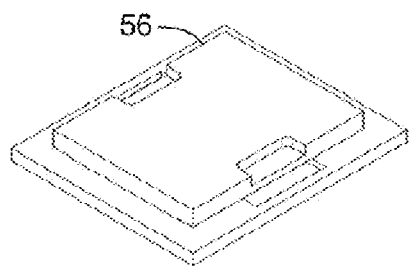
Figure 8C:
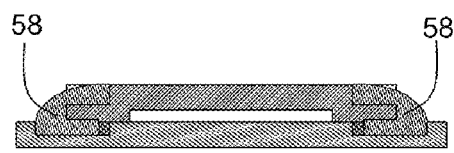

FIG. 8a is an exploded view of an optoelectronic package according to still another embodiment of the present patent application. FIG. 8b is a perspective view of the assembled optoelectronic package depicted in FIG. 8a. FIG. 8c is a cross-sectional view of the optoelectronic package depicted in FIG. 8a. Referring to FIGS. 8a-8c, in this embodiment, there are additional cutouts 57 formed at the sides of the cover element 56. The cutouts 57 are aligned with the undercut 53 after the first adhesive bonding. This allows the second adhesive to have larger contact area with the cover element 56.

In the above embodiment, two cutouts 57 are formed at two opposite sides of the cover element 56 respectively and aligned with the two undercuts 53 respectively. The engagement of the two undercuts 53 and the two cutouts 57 defines the second adhesive bonding area.

In another embodiment, an optoelectronic package includes a substrate and a cover element bonded onto the substrate. The cover element defines a cavity for accommodating semiconductor chips and optoelectronic components, and includes functional features aligned with the optoelectronic components. The cover element includes a first adhesive bonding area configured for receiving a first adhesive and being bonded with a predetermined region of the substrate by the first adhesive. The engagement of the cover element and the substrate defines a second adhesive bonding area. The second adhesive bonding area is configured for receiving a second adhesive and confining the second adhesive within a localized area.

The optoelectronic package provided by the above-mentioned embodiments achieves benefits such as good bonding strength between the cover element and the substrate over the entire product life, minimal shift or movement of the cover element during the final curing, and minimal shift or movement of the cover element in the lifetime of the product. These benefits help to maintain the function of the assembly to be stable, to increase the yield of the assembly, and to increase the integrity of the package to pass the mechanical reliability tests required in the industry.

While the present patent application has been shown and described with particular references to a number of embodiments thereof, it should be noted that various other changes or modifications may be made without departing from the scope of the present invention.

What is claimed is:

1. An optoelectronic package comprising:
   a substrate;
   a cover element bonded onto the substrate, the cover element defining a cavity for accommodating semiconductor chips and optoelectronic components; wherein:
   the cover element comprises a first adhesive bonding area configured for receiving a first adhesive and being bonded with a predetermined region of the substrate by the first adhesive; and
   the engagement of the cover element and the substrate defines a second adhesive bonding area, the second adhesive bonding area being configured for receiving a second adhesive and confining the second adhesive within a localized area;
   wherein the cover element comprises two thinned-down recess regions formed at two opposite sides of the cover element respectively, the engagement of the two thinned-down recess regions and the substrate defining the second adhesive bonding area; the second adhesive bonding area comprises a floor defined by the substrate and side walls defined by the two thinned-down recess regions; and
   wherein a through hole is formed within each of the thinned-down recess regions; and
   wherein the second adhesive fills in the through hole to further bond the substrate and cover element.

2. An optoelectronic package comprising:
   a substrate;
   a cover element bonded onto the substrate, the cover element defining a cavity for accommodating semiconductor chips and optoelectronic components, and comprising functional features aligned with the optoelectronic components; wherein:
   the cover element comprises a first adhesive bonding area configured for receiving a first adhesive and being bonded with a predetermined region of the substrate by the first adhesive; and
   the engagement of the cover element and the substrate defines a second adhesive bonding area, the second adhesive bonding area being configured for receiving a second adhesive and confining the second adhesive within a localized area;
   wherein the cover element comprises two steps defining two cutout recess regions formed at two opposite sides of the cover element respectively, the engagement of the two steps and the substrate defining the second adhesive bonding area; and the second adhesive bonding area comprises a floor defined by the substrate and side walls defined by the two steps.

* * * * *